United States Patent
Isodono et al.

(10) Patent No.: US 6,724,182 B2
(45) Date of Patent: Apr. 20, 2004

(54) TESTER AND TESTING METHOD FOR DIFFERENTIAL DATA DRIVERS

(75) Inventors: Koji Isodono, Kashiba (JP); Toyohiko Tanaka, Yamatokoriyama (JP); Hitoshi Imai, Tenri (JP); Hitoshi Saitoh, Sakurai (JP)

(73) Assignee: Sharp Kabushiki Kaisha, Osaka (JP)

( * ) Notice: Subject to any disclaimer, the term of this patent is extended or adjusted under 35 U.S.C. 154(b) by 101 days.

(21) Appl. No.: 10/093,536

(22) Filed: Mar. 11, 2002

(65) Prior Publication Data

US 2002/0180414 A1 Dec. 5, 2002

(30) Foreign Application Priority Data

Jun. 5, 2001 (JP) ........................................ 2001-169750

(51) Int. Cl.[7] .............................. G01R 31/00; G06F 7/42
(52) U.S. Cl. .................... 324/158.1; 324/73.1; 327/361
(58) Field of Search ..................... 324/73.1, 761–765, 324/158.1; 326/56–59, 86, 90; 327/108–109, 352, 359–361, 561–563

(56) References Cited

U.S. PATENT DOCUMENTS

| | | | | |
|---|---|---|---|---|
| 5,107,230 A | * | 4/1992 | King | 326/86 |
| 5,682,337 A | * | 10/1997 | El-Fishawy et al. | 324/158.1 |
| 5,942,922 A | * | 8/1999 | Dinteman et al. | 327/108 |

* cited by examiner

*Primary Examiner*—Minh N. Tang
(74) *Attorney, Agent, or Firm*—Birch, Stewart, Kolasch & Birch, LLP (57) ABSTRACT

A pair of resistors, having substantially equivalent resistance are arranged in series so that two data output lines of a differential data driver are connected to the ends of the series of resistors, the potentials of the two output signals ((D+) data output signal and (D−)data output signal) from the differential data driver are resistively divided to detect the sum of the potentials of the two signals. Based on the voltage of the combined signal, the acceptability of the differential signals of the differential data driver is determined.

7 Claims, 10 Drawing Sheets

TESTER AND TESTING METHOD FOR DIFFERENTIAL DATA DRIVERS

BACKGROUND OF THE INVENTION (1) Field of the Invention

The present invention relates to a tester and testing method for differential data drivers.

(2) Description of the Prior Art

Figure 1:
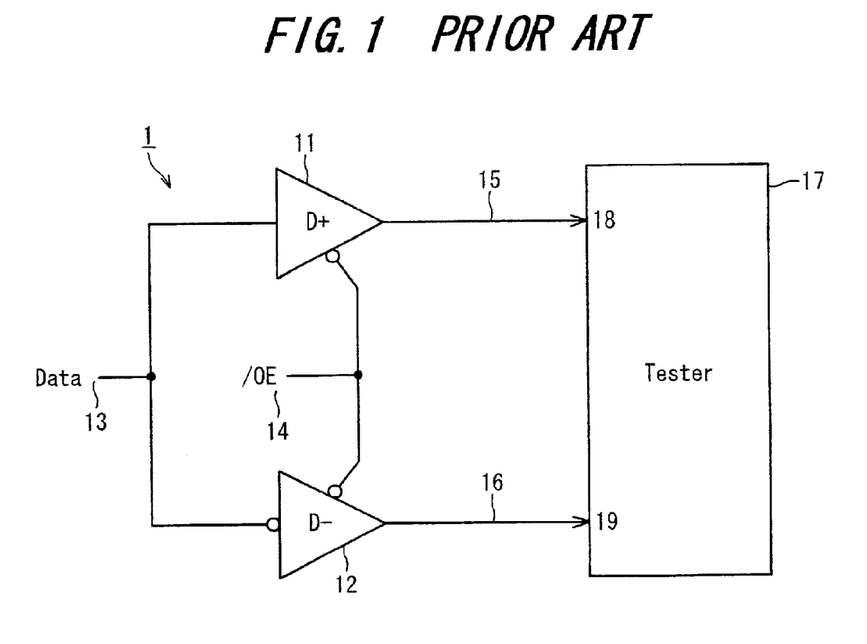
FIG. 1 is a schematic block diagram showing a conventional tester for a differential data driver.
Figure 2:
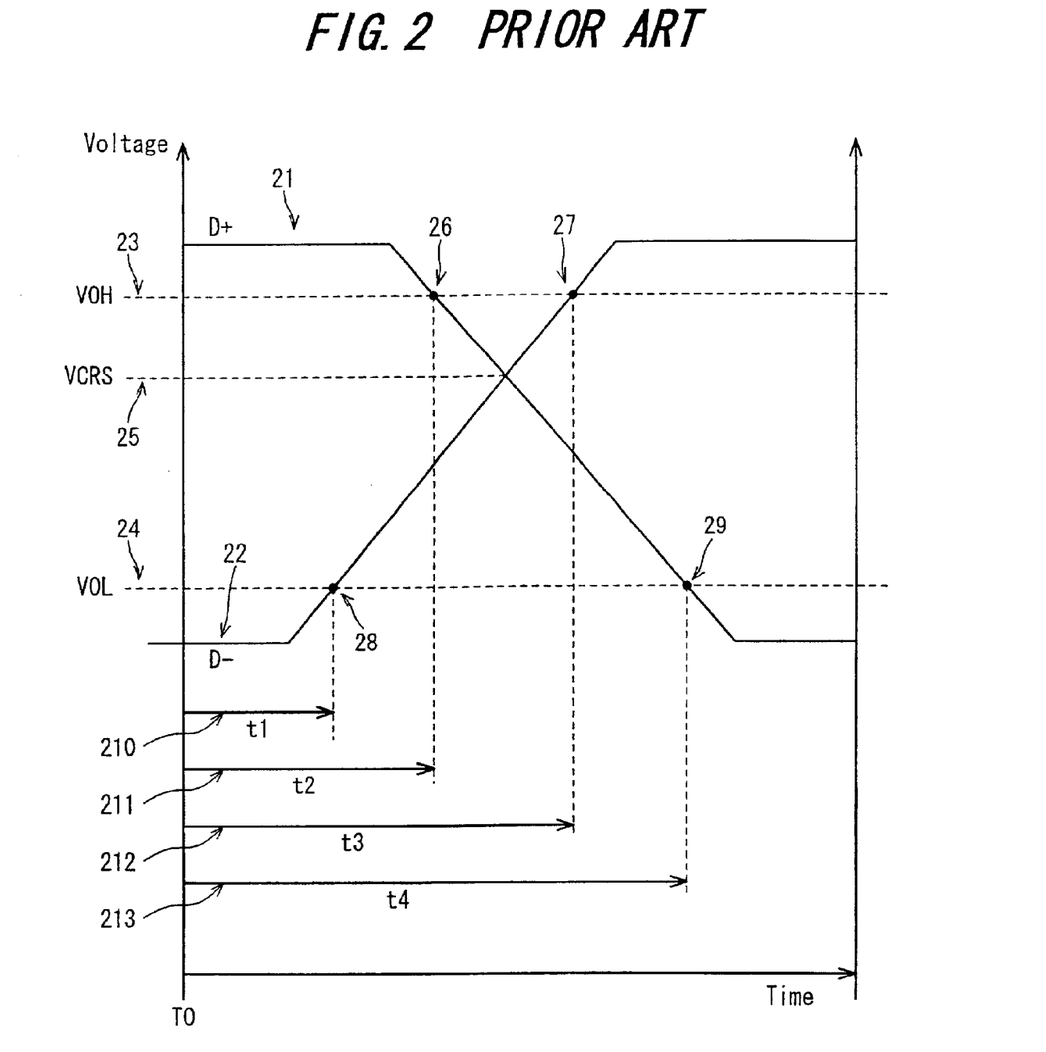
FIG. 2 is a waveform chart showing crossover voltage waveforms of a differential data driver.

FIG. 1 is a schematic block diagram showing a conventional differential data driver tester. FIG. 2 is a waveform chart showing crossover voltage waveforms of a differential data driver. As shown in FIG. 1, in a differential data driver 1, data input from a data input terminal 13 is supplied to a (D+)data output driver 11 and (D−)data output driver 12. An enable signal is supplied from a driver output enable signal terminal 14 so as to set (D+)data output driver 11 and (D−)data output driver 12 into data output states, whereby differential signals via (D+)data output line 15 and (D−)data output line 16 are transferred to a (D+)data input terminal 18 and (D−)data input terminal 19 of a tester 17, respectively. For this differential data driver 1 to transfer differential data, it is necessary that as shown in FIG. 2, the crossover voltage(VCRS), designated by 25, between output signal 21 transferred from (D+)data output driver 11 and output signal 22 transferred from (D−)data output driver 12, should fall within a reference voltage range, specified by a crossover upper limit voltage(VOH) 23 and crossover lower limit voltage(VOL) 24.

Conventionally, the test on the differential signals in differential data driver 1 has been made in the following manner. Time(t1) 210 at which (D−)data output signal 22 has reached a point 28 or crossover lower limit voltage (VOL) 24 and time(t2) 211 at which (D+)data output signal 21 has reached a point 26 or crossover upper limit voltage (VOH) 23 are measured from a certain time t0. Similarly, time(t3) 212 at which (D−)data output signal 22 has reached a point 27 or crossover upper limit voltage(VOH) 23 and time(t4) 213 at which (D+)data output signal 21 has reached a point 29 or crossover lower limit voltage(VOL) 24 are measured. In tester 17, when these measured values satisfy t1<t4 and t2<t3, crossover voltage (VCRS) 25 are determined to fall between crossover upper limit voltage (VOH) 23 and crossover lower limit voltage(VOL) 24, and hence the measured differential signals are determined to meet the specifications.

However, in the above testing method, when it is to be examined whether the crossover voltage (VCRS) 25 falls within the reference voltage range, time and voltage measurements need to be made at, at least, four points. This makes the tester 17 configuration complex.

In tester 17, the differential signal transferred via a (D+)data output line 15 from (D+)data output driver 11 of differential data driver 1 and the differential signal transferred via a (D−)data output line 16 from (D−)data output driver 12 are tested separately. Therefore, the problem of channel-to-channel skew occurs upon measurement. Thus, in the conventional technique, the precise measurement of the differential signals from differential data driver 1 has been difficult to be made.

SUMMARY OF THE INVENTION

The present invention has been devised in order to solve the above problems and it is therefore an object of the present invention to provide a tester circuit and testing method for a differential data driver which has a simple configuration and yet can test the differential signals with a high precision.

As the means for achieving the above object, the present invention is configured as follows:

In accordance with the first aspect of the present invention, a tester for differential data drivers is characterized in that the acceptability of two differential signals from two data output terminals of a differential data driver is determined based on the sum of the voltages of the two signals.

In accordance with the second aspect of the present invention, the tester for differential data drivers having the above first feature is characterized in that a pair of resistors, having substantially equivalent resistance are arranged in series so that the two data output terminals of the differential data driver are connected to the ends of the series of resistors, whereby the sum of the potentials of the two signals are detected by resistively dividing the potentials of the two output signals from the differential data driver.

In accordance with the third aspect of the present invention, the tester for differential data drivers having the above second feature is characterized in that a switching device is arranged at each end of the series of resistors.

In accordance with the fourth aspect of the present invention, the tester for differential data drivers having the above third feature is characterized in that the switching devices are opened when tests other than the acceptability judgement as to the differential signals are implemented.

In accordance with the fifth aspect of the present invention, a testing method for differential data drivers is characterized in that the acceptability of two differential signals from two data output terminals of a differential data driver is determined based on the sum of the voltages of the two signals.

In the configuration of the present invention, the tester for differential data drivers determines the acceptability of the differential signals from a differential data driver, based on the sum of the voltages of the two signals output from two data output terminals of the differential data driver. Accordingly, it is possible to make a judgement as to the acceptability of the differential signals without measuring any elapsed time, hence simplify the tester configuration. Further, since the sum of the voltages of the (D+)data output signal and (D−)data output signal is examined, the tester can make the test using a single channel. Accordingly, it is possible to implement high-precision measurement without being affected by channel-to-channel skew.

In the configuration of the present invention, the tester for differential data drivers includes a series of two resistors, having substantially equivalent resistance and arranged in such a manner that the two data output terminals of the differential data driver are connected to the ends of the series of resistors, whereby the sum of the potentials of the two signals is detected by resistively dividing the potentials of the two output signals from the differential data driver. Therefore, the configuration of the tester can be made simple. Further, the combined signal of the (D+)data output signal and (D−)data output signal is used for testing, so that the test can be implemented using a single channel of the tester, which makes high-precision measurement free from influence of channel-to-channel skew possible.

In the tester for differential data drivers thus configured in the present invention, a switching device is arranged at each end of the series of resistors. Therefore, tests for other than the acceptability judgment as to the differential signals can be implemented excluding the influence of the series of resistors.

In the tester for differential data drivers thus configured in the present invention, the switching devices are opened when tests other than the acceptability judgement as to the differential signals are implemented. Accordingly, the series of resistors can be used appropriately depending on the purpose of the test in the tester.

In the configuration of the present invention, the acceptability of the differential signals from a differential data driver is determined based on the sum of the voltages of the two signals output from two data output terminals of the differential data driver. Therefore, the acceptability judgement as to the differential signals can be made without measuring any elapsed time, thus making it possible to test differential data drivers easily.

DESCRIPTION OF THE PREFERRED EMBODIMENTS

Figure 3:
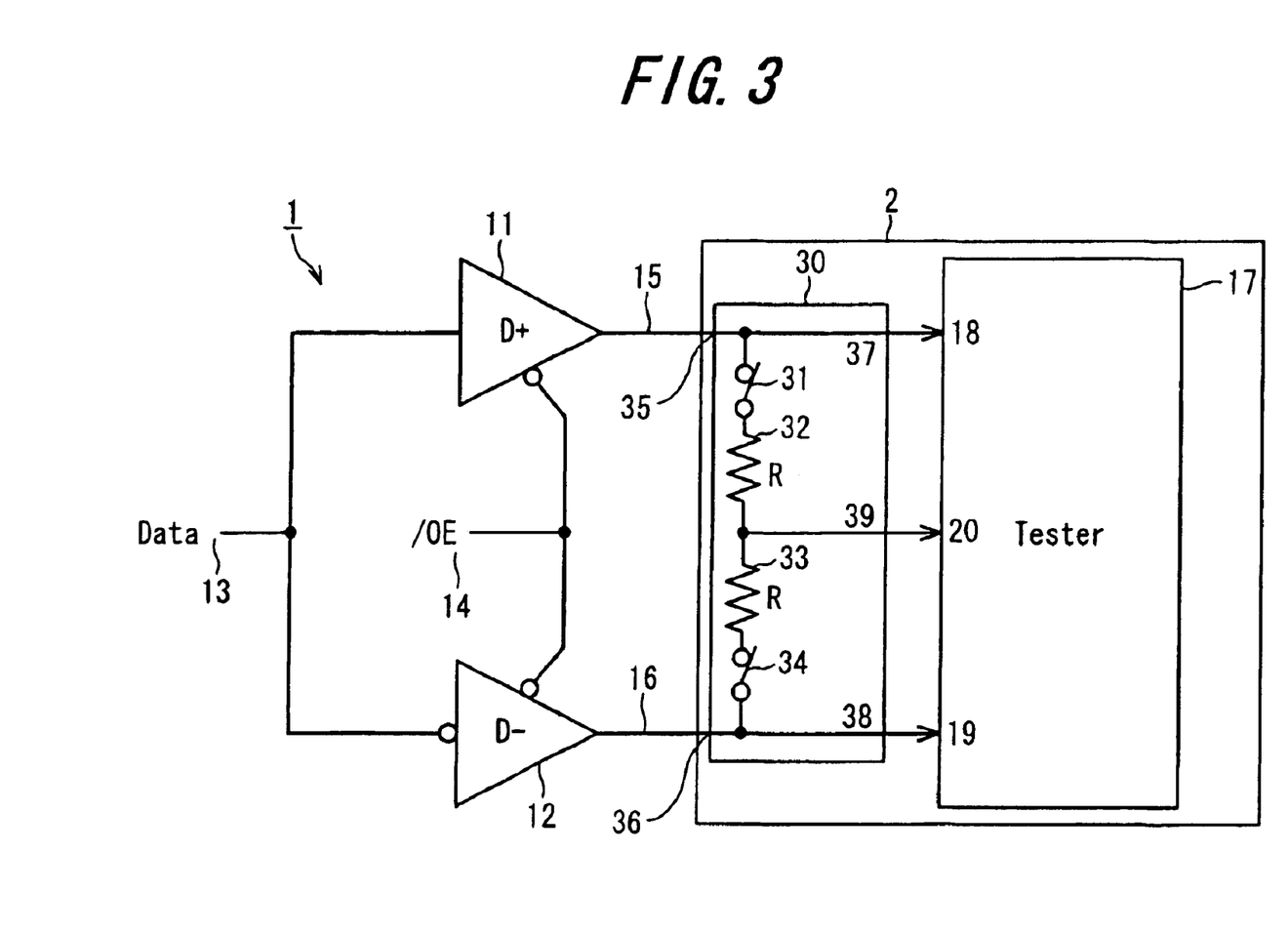
FIG. 3 is a block diagram showing a differential data driver tester in accordance with the embodiment of the present invention.

FIG. 3 is a block diagram showing a differential data driver tester in accordance with the embodiment of the present invention. The diagram shown in FIG. 3 is a circuit configuration for checking the crossover voltage. In FIG. 3, the same components as in the FIG. 1 are allotted with the same reference numerals. A differential data driver 1 has the same configuration as that shown in FIG. 1, and includes a (D+)data output driver 11 and (D−)data output driver 12. The (D+)data output driver 11 and (D−)data output driver 12 receive the same signal and output differential signals (signals having phases inverted to each other). The input terminals to (D+)data output driver 11 and (D−)data output driver 12 are both connected to a data input terminal 13. The enables terminals of (D+)data output driver 11 and (D−)data output driver 12 are both connected to an enable signal input terminal 14. The output terminal from (D+)data output driver 11 is connected to a (D+)data output line 15, and the output terminal from (D−)data output driver 12 is connected to a (D−)data output line 16.

A tester 2 is composed of a tester 30 that outputs a composite signal and a tester 17 connected to tester 30, in order to determine the acceptability of the differential signals from the differential data driver based on the sum of the voltages of the two signals output from the two data output terminals of the differential data driver. In sum, the elapsed time measuring circuit is unused or removed from the conventional tester 17. Further, in order to check the crossover voltage of differential data driver 1, a composite signal input terminal 20 is provided so as to measure the voltage of the combined signal by the voltage measuring circuit.

In order to output a composite signal, tester 30 has a relay switch 31 as a switching means and a series of resistors 32 and 33 and another relay switch 34 as a switching means. These elements are connected in series in the order mentioned. Tester 30 has a (D+)data input terminal 35, (D−)data input terminal 36, (D+)data output terminal 37, (D−)data output terminal 38 and composite signal output terminal 39. The (D+)data input terminal 35 and (D+)data output terminal 37 are connected directly, so are the (D−)data input terminal 36 and (D−)data output terminal 38. The terminal of relay switch 31 on the side opposite to that connected to resistor 32 is connected to (D+)data input terminal 35, and the terminal of relay switch 34 on the side opposite to that connected to resistor 33 is connected to (D−)data input terminal 36. Connected between resistors 32 and 33 arranged in series is the composite signal output terminal 39.

Between testers 30 and 17, (D+)data output terminal 37 and (D+)data input terminal 18, (D−)data output terminal 38 and (D−)data input terminal 19, and composite signal output terminal 39 and composite signal input terminal 20 are connected.

Resistors 32 and 33 in tester 30 have substantially equivalent resistance. Relay switches 31 and 34 can be opened and closed in response to the signals from an unillustrated controller included in tester 2.

The predetermined data input from data input terminal 13 is supplied to (D+)data output driver 11 and (D−)data output driver 12. While the enable signal supplied from enable signal input terminal 14 is in the data output state, (D+)data output driver 11 and (D−)data output driver 12 output (D+)data output signal and (D−)data output signal, respectively as the differential signals. These differential output signals are transferred to testers 30 and 17 by way of (D+)data output line 15 and (D−)data output line 16.

While the differential signals are to be checked, relay switches 31 and 34 are turned on so that the (D+)data output and (D−)data output are resistively divided by resistors 32 and 33 of substantially equivalent resistance in tester 30. Thereby, the composite signal as the sum of the voltages of the two signals can be transferred to composite signal input terminals 20 of tester 17 by way of composite signal output terminal 39. Tester 17, based on the composite signal of differential data driver 1 transferred from tester 30, determines the acceptability of the crossover voltage.

In this way, checking the composite signal of the (D+)data output signal and (D−)data output signal makes it possible to test the signals on the same channel in the tester, which enables high-precision measurement free from the influence of channel-to-channel skew.

In tester 30, normal tests other than the crossover voltage test should be made with relay switches 31 and 34 turned off. This is because no composite signal needs to be checked for the normal tests of differential data driver 1.

Next, (D+)output signal and (D−)output signal transferred from differential data driver 1 to tester 17 by way of tester 30 and the composite signal will be described. The composite signal generated by tester 30 assumes various waveforms depending on the states of the (D+)output signal and (D−)output signal from differential data driver 1. FIGS. 4 to 10 show various waveform examples when the (D+)output signal and (D−)output signal take different conditions. In this embodiment, the output currents from (D+)output driver 11 and (D−)output driver 12 are assumed to be equal.

Figure 4:
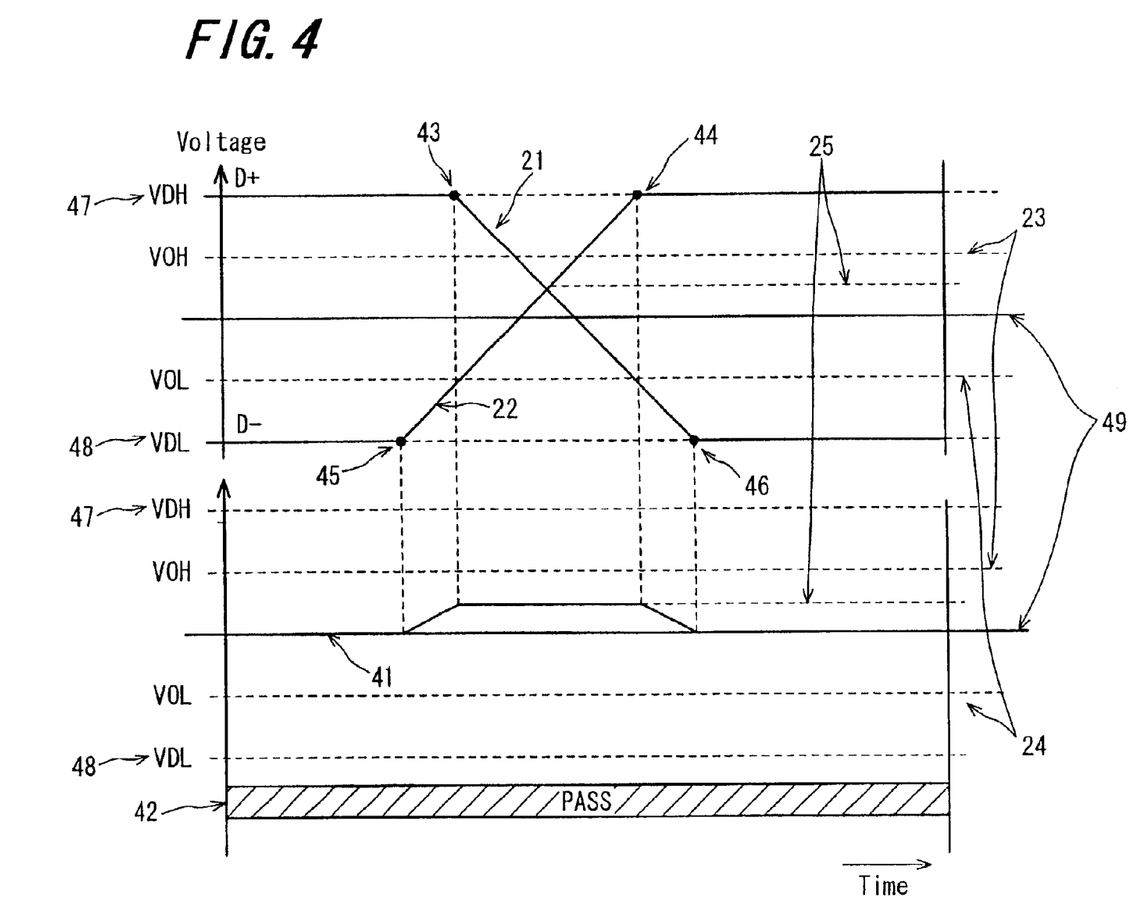
FIG. 4 is a signal waveform chart showing a case where the crossover voltage (VCRS) 25 falls in the range between the mean voltage 49 of the high data output voltage(VDH) 47 and the low data output voltage(VDL) 48 and the crossover upper limit voltage(VOH) 23.

FIG. 4 is a signal waveform chart showing a case where the crossover voltage (VCRS) 25 falls in the range between the mean voltage 49 of the high data output voltage(VDH) 47 and the low data output voltage(VDL) 48 and the crossover upper limit voltage(VOH) 23. In FIG. 4, up to the start point 45 of the positive-going transition of the (D−)data, the (D+)data output signal 21 is at a potential equal to the high data output voltage(VDH) 47 and the (D−)data output signal 22 is at a potential equal to the low data output voltage(VDL) 48, so the potential of composite signal 41 is equal to (½) (VDH+VDL). From the start point 45 of the positive-going transition of the (D−)data up to the start point 43 of the negative-going transition of the (D+)data, composite signal 41 presents a potential of (½)[(the potential of the (D−)data output signal)+VDH]. Further, from the start point 43 of the negative-going transition of the (D+)data up to the end point 44 of the positive-going transition of the (D−)data, composite signal 41 presents a potential of (½) [(the potential of the (D−)data output signal)+(the potential of the (D+)data output signal)]. The potential of composite signal 41 during this period will never exceed the crossover voltage(VCRS) 25 at which the potential of (D+)output signal is equal to that of (D−)output signal. Subsequently, from the end point 44 of the positive-going transition of the (D−)data up to the end point 46 of the negative-going transition of the (D+)data, composite signal 41 presents a potential of (½)[VDH+(the potential of the (D+)data output signal)]. From the end point 46 of the negative-going transition of the (D+)data and afterwards, composite signal 41 again takes a potential of (½)(VDH+VDL).

This composite signal 41 is supplied from tester 30 to tester 17. In tester 17, a strobe signal 42 is checked so as to determine whether the crossover voltage (VCRS) 25 falls within the reference voltage range defined by the crossover upper limit voltage(VOH) 23 and the crossover lower limit voltage(VOL) 24, whereby the acceptability of the crossover voltage(differential voltage) of differential data driver 1 can be determined. In the example shown in FIG. 4, since the voltage of composite signal 41 is lower than the crossover upper limit voltage(VOH) 23 and higher than the crossover lower limit voltage(VOL) 24, the composite signal 41 also falls within the reference voltage range. Therefore, this test result(product) by tester 2 is concluded to be acceptable.

Figure 5:
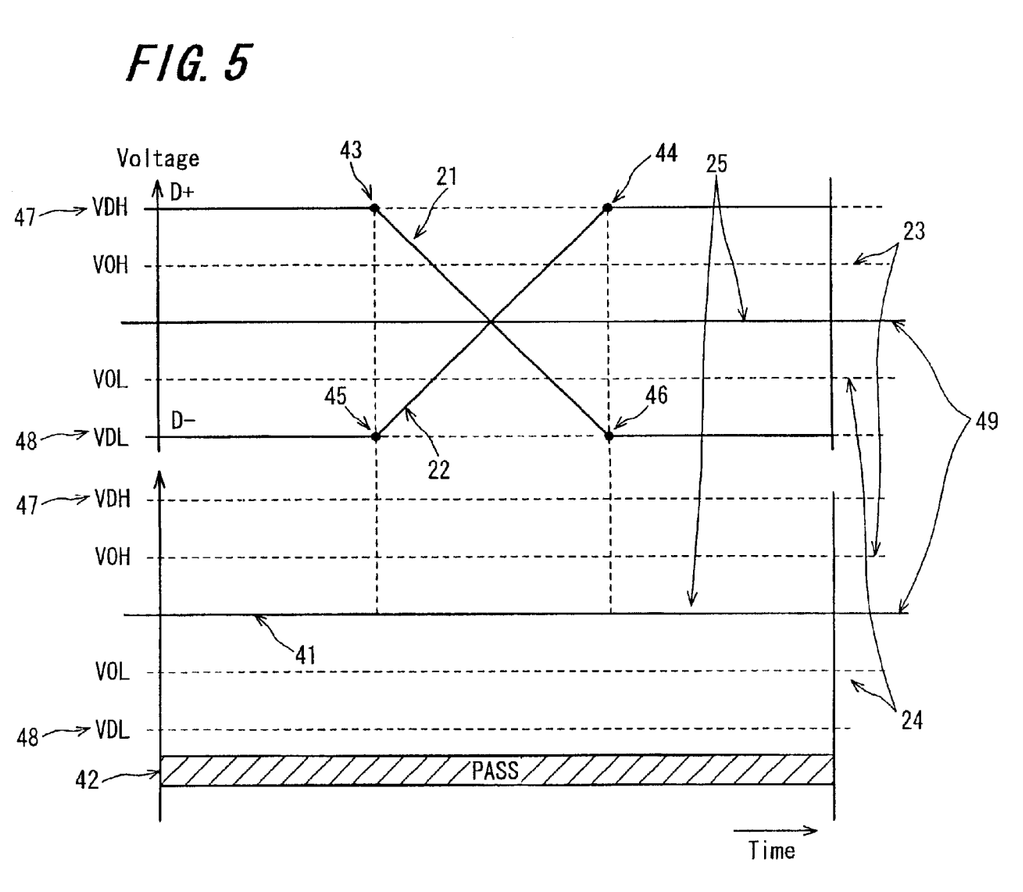
FIG. 5 is a signal waveform chart showing a case where the crossover voltage (VCRS) 25 is equal to the mean voltage 49 of the high data output voltage(VDH) 47 and the low data output voltage(VDL) 48.

FIG. 5 is a signal waveform chart showing a case where the crossover voltage (VCRS) 25 is equal to the mean voltage 49 of the high data output voltage(VDH) 47 and the low data output voltage(VDL) 48. In FIG. 5, the start point 45 of the positive-going transition of the (D−)data and the start point 43 of the negative-going transition of the (D+) data coincide to each other and the end point 44 of the positive-going transition of the (D−)data and the end point 46 of the negative-going transition of the (D+)data coincide to each other. Until the start point 43 of the negative-going transition of the (D+)data (the start point 45 of the positive-going transition of the (D−)data), the (D+)data output signal 21 is at the high data output voltage(VDH) 47 and the (D−)data output signal 22 is at the low data output voltage (VDL) 48, so the potential of composite signal 41 is equal to (½)(VDH+VDL). From the start point 43 of the negative-going transition of the (D+)data (the start point 45 of the positive-going transition of the (D−)data) up to the end point 44 of the positive-going transition of the (D−)data(the end point 46 of the negative-going transition of the (D+)data), the potential of composite signal 41 is equal to (½)[(the potential of the (D−)data output signal)+(the potential of the (D+)data output signal)]=(½)(VDH+VDL). Subsequently, from the end point 44 of the positive-going transition of the (D−)data(the end point 46 of the negative-going transition of the (D+)data) and afterwards, the potential of composite signal 41 is also equal to (½)(VDH+VDL).

Accordingly, similarly to the case of FIG. 4, the voltage of composite signal 41 in this case also falls within the reference voltage range, so that the test result(product) by tester 2 is concluded to be acceptable.

Figure 6:
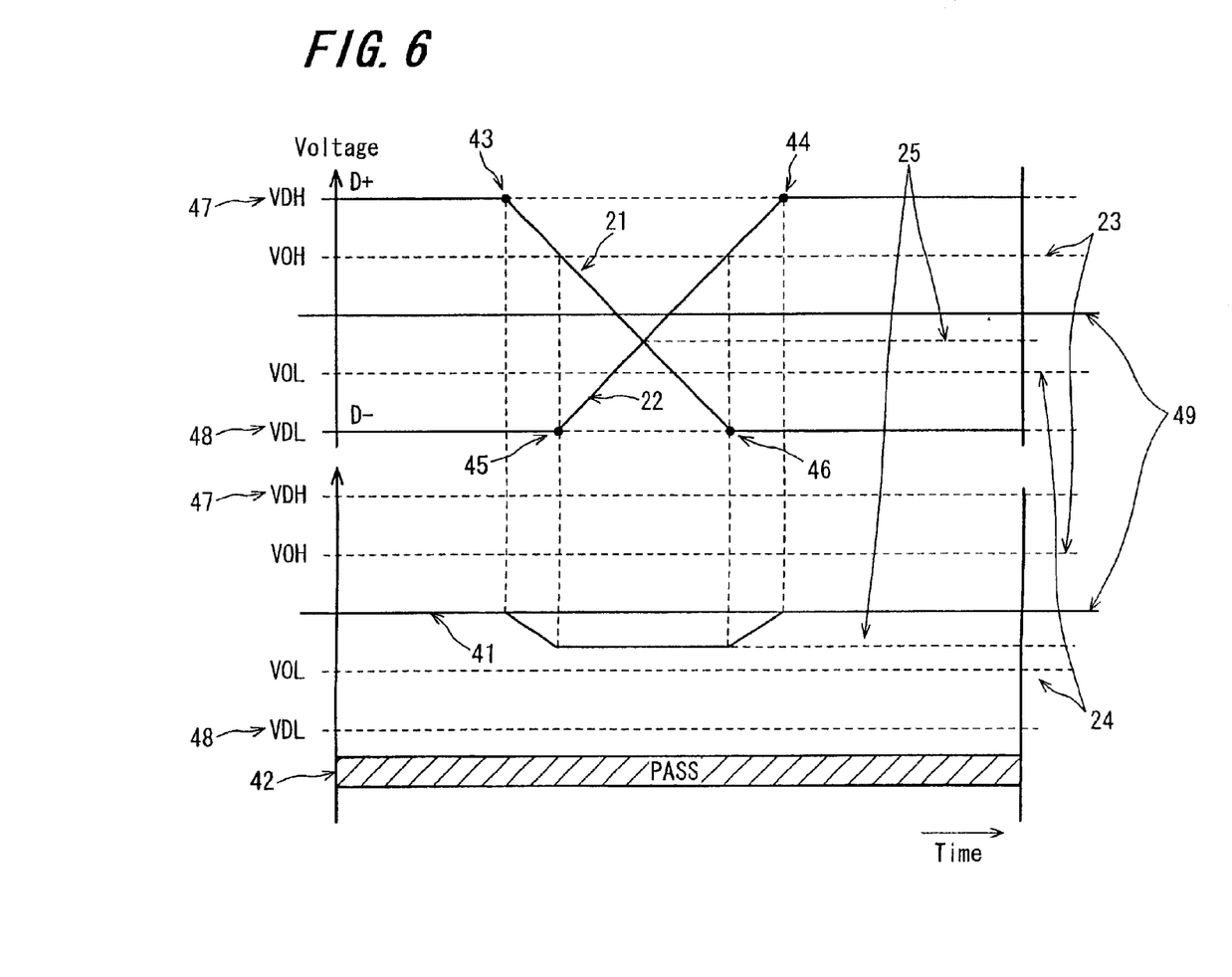
FIG. 6 is a signal waveform chart showing a case where the crossover voltage (VCRS) 25 falls in the range between the mean voltage 49 of the high data output voltage(VDH) 47 and the low data output voltage(VDL) 48 and the crossover lower limit voltage(VOL) 24.

FIG. 6 is a signal waveform chart showing a case where the crossover voltage (VCRS) 25 falls in the range between the mean voltage 49 of the high data output voltage(VDH) 47 and the low data output voltage(VDL) 48 and the crossover lower limit voltage(VOL) 24. In FIG. 6, up to the start point 43 of the negative-going transition of the (D+) data, the (D+)data output signal 21 is at a potential equal to the high data output voltage(VDH) 47 and the (D−)data output signal 22 is at a potential equal to the low data output voltage(VDL) 48, so the potential of composite signal 41 is equal to(½)(VDH+VDL). From the start point 43 of the negative-going transition of the (D+)data up to the start point 45 of the positive-going transition of the (D−)data, composite signal 41 presents a potential of (½)[(the potential of the(D+)data output signal)+VDL]. Further, from the start point 45 of the positive-going transition of the (D−)data up to the end point 46 of the negative-going transition of the (D+)data, composite signal 41 presents a potential of (½) [(the potential of the (D−)data output signal)+(the potential of the (D+)data output signal)]. The potential of composite signal 41 during this period will never become lower than the crossover voltage(VCRS) 25 at which the potential of (D+)output signal is equal to that of (D−)output signal. Subsequently, from the end point 46 of the negative-going transition of the (D+)data up to the end point 44 of the positive-going transition of the (D−)data, the composite signal 41 presents a potential of (½)[VDL+(the potential of the (D−)data output signal)]. From the end point 44 of the positive-going transition of the (D−)data and afterwards, the composite signal 41 again takes a potential of (½)(VDH+VDL).

Accordingly, similarly to the case of FIG. 4, the voltage of composite signal 41 in this case also falls within the reference voltage range, so that the test result(product) by tester 2 is concluded to be acceptable.

Figure 7:
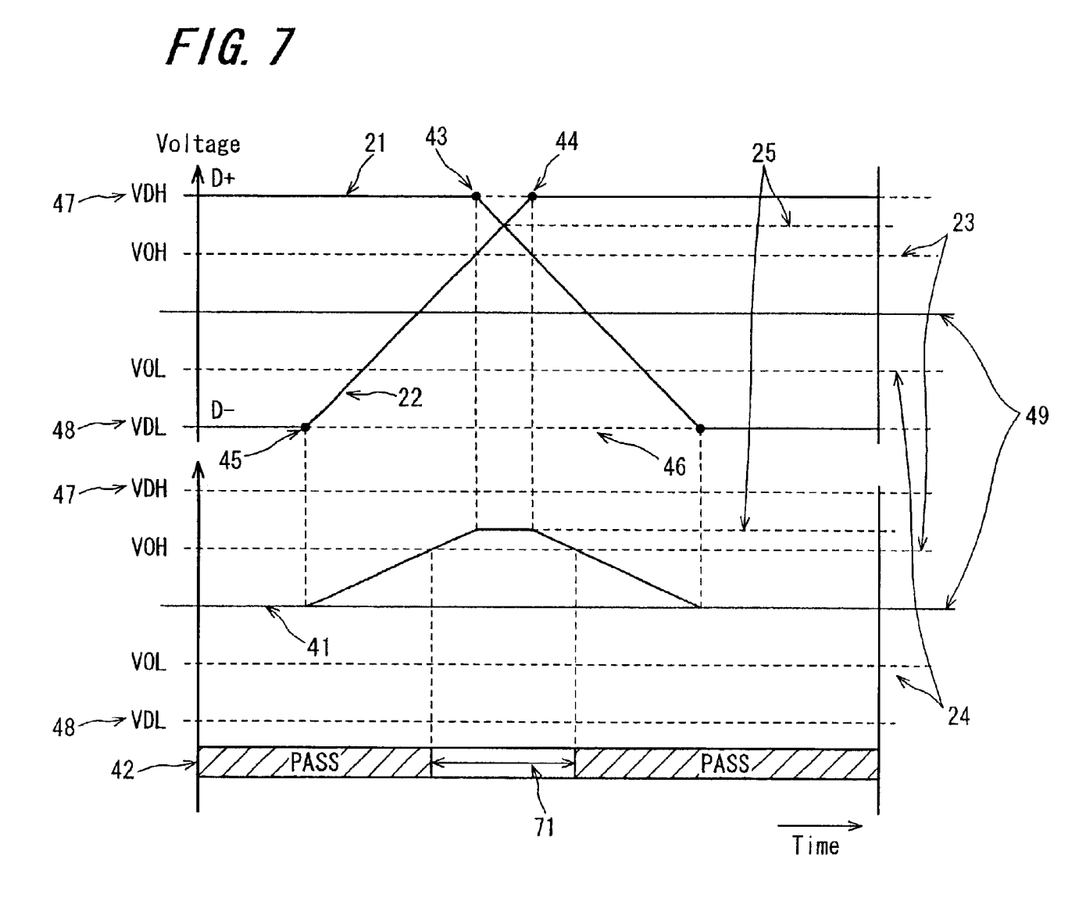
FIG. 7 is a signal waveform chart showing a case where the crossover voltage (VCRS) 25 is higher than the crossover upper limit voltage(VOH) 23 and lower than the high data output voltage(VDH) 47.

Next, the cases where the test result by tester 17 is determined to be defective will be described. FIG. 7 is a signal waveform chart showing a case where the crossover voltage (VCRS) 25 is higher than the crossover upper limit voltage(VOH) 23 and lower than the high data output voltage(VDH) 47. In FIG. 7, the potential of composite signal 41 changes over time similarly to that shown in FIG. 4. In this case, however, the crossover voltage (VCRS) 25 rises to a potential between the crossover upper limit voltage (VOH) 23 and the high data output voltage(VDH) 47. Therefore, the composite signal 41 exceeds the reference voltage range defined by crossover upper limit voltage (VOH) 23 and crossover lower limit voltage(VOL) 24. Therefore, a fail period 71 during which composite signal 41 fails to fall within the reference voltage range or falls above the crossover upper limit voltage(VOH) 23 is detected from the strobe signal 42. Thus, it is possible for tester 2 to detect the fact that the crossover voltage(VCRS) 25 fails to fall within the reference voltage range.

Figure 8:
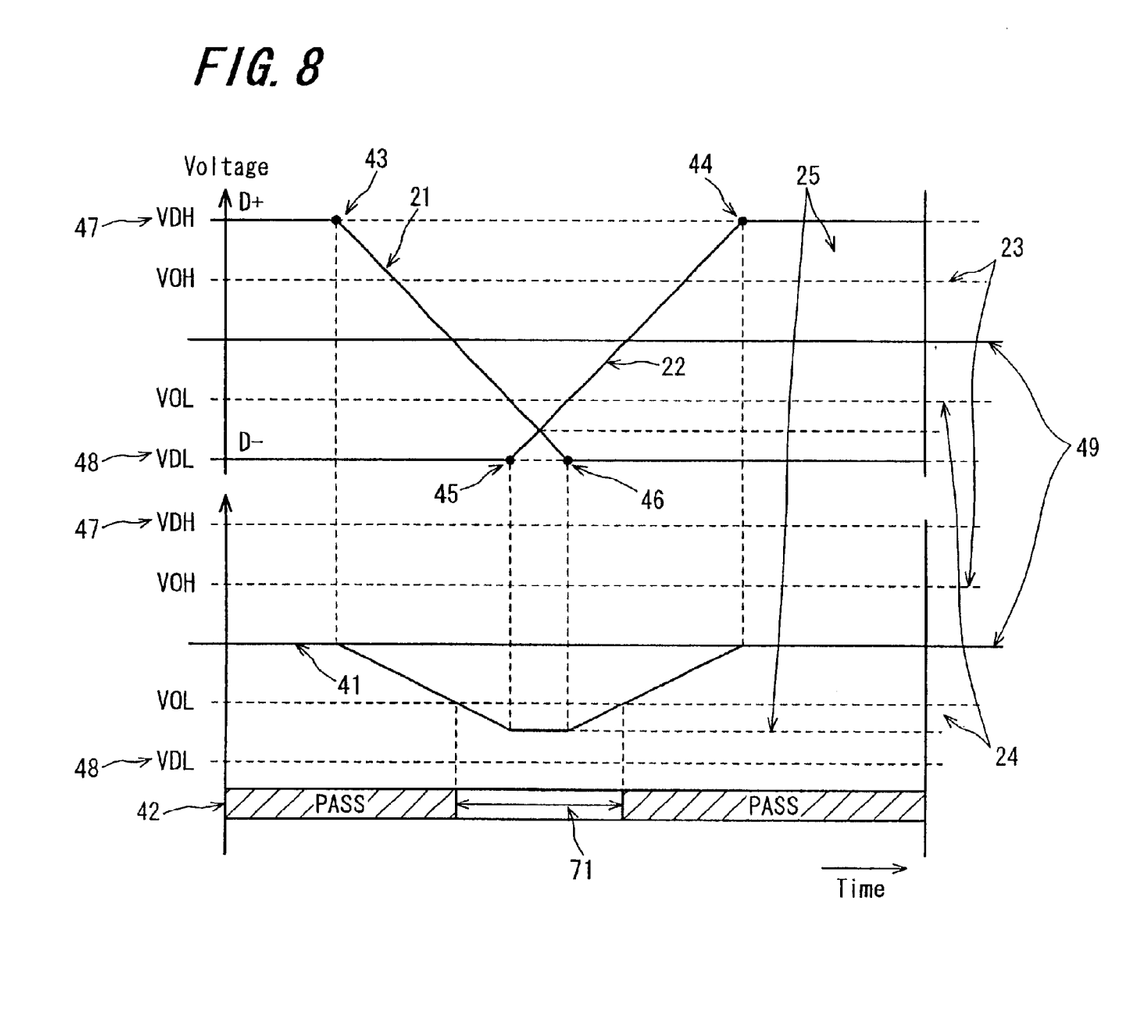
FIG. 8 is a signal waveform chart showing a test fail case where the crossover voltage (VCRS) 25 is lower than the crossover lower limit voltage(VOL) 24 and higher than the low data output voltage(VDL) 48, hence failing to fall within the reference voltage range.

FIG. 8 is a signal waveform chart showing a test fail case where the crossover voltage (VCRS) 25 is lower than the crossover lower limit voltage(VOL) 24 and higher than the low data output voltage(VDL) 48, hence failing to fall within the reference voltage range.

In FIG. 8, the potential of composite signal 41 changes over time similarly to that shown in FIG. 6. In this case, however, the composite signal 41 becomes lower to the crossover voltage(VCRS) which fall out of the reference voltage range defined by crossover upper limit voltage (VOH) 23 and crossover lower limit voltage(VOL)24. Therefore, similarly to the case shown in FIG. 7 it is possible for tester 2 to detect the fact that the crossover voltage (VCRS) 25 fails to fall within the reference voltage range.

Figure 9:
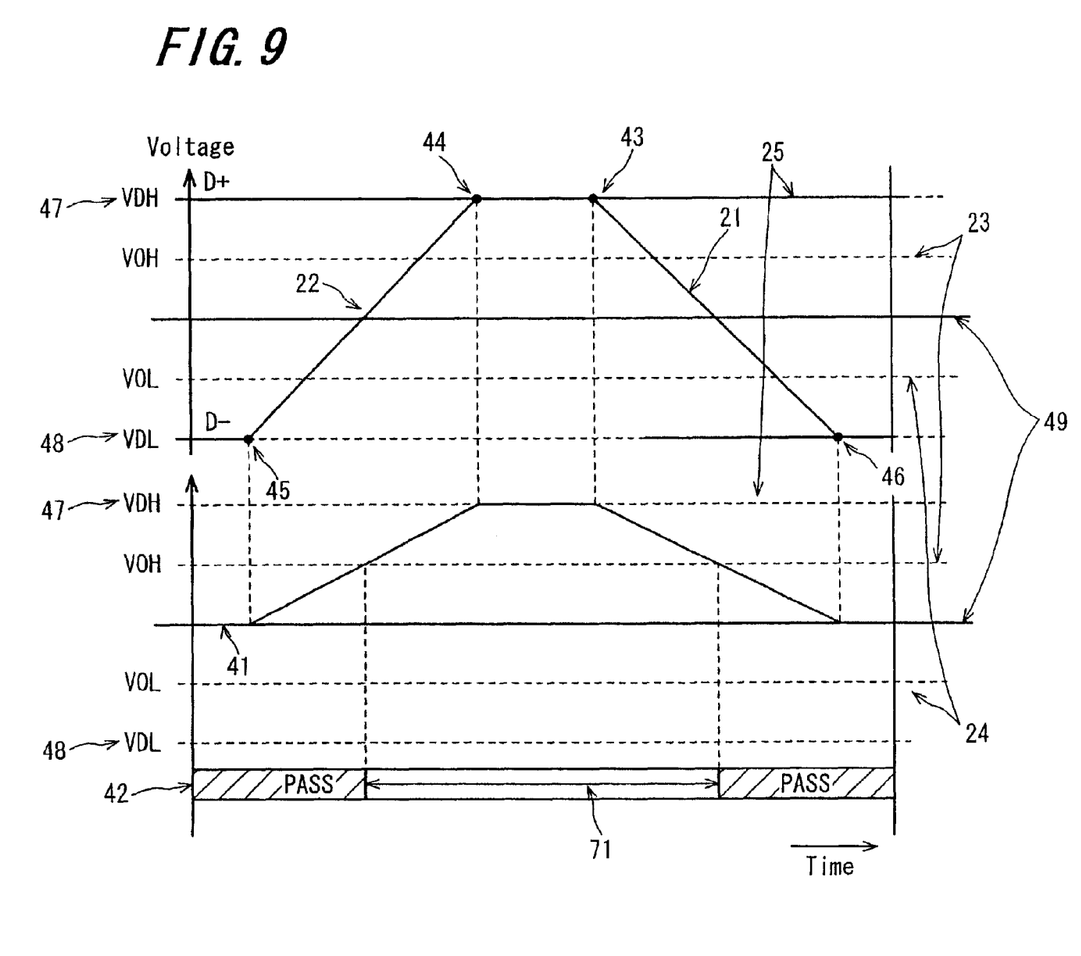
FIG. 9 is a signal waveform chart showing a test fail case where (D+)data output signal 21 and (D−)data output signal 22 do not cross each other during their transitions, hence there is no crossover voltage falling within the reference voltage range.
Figure 10:
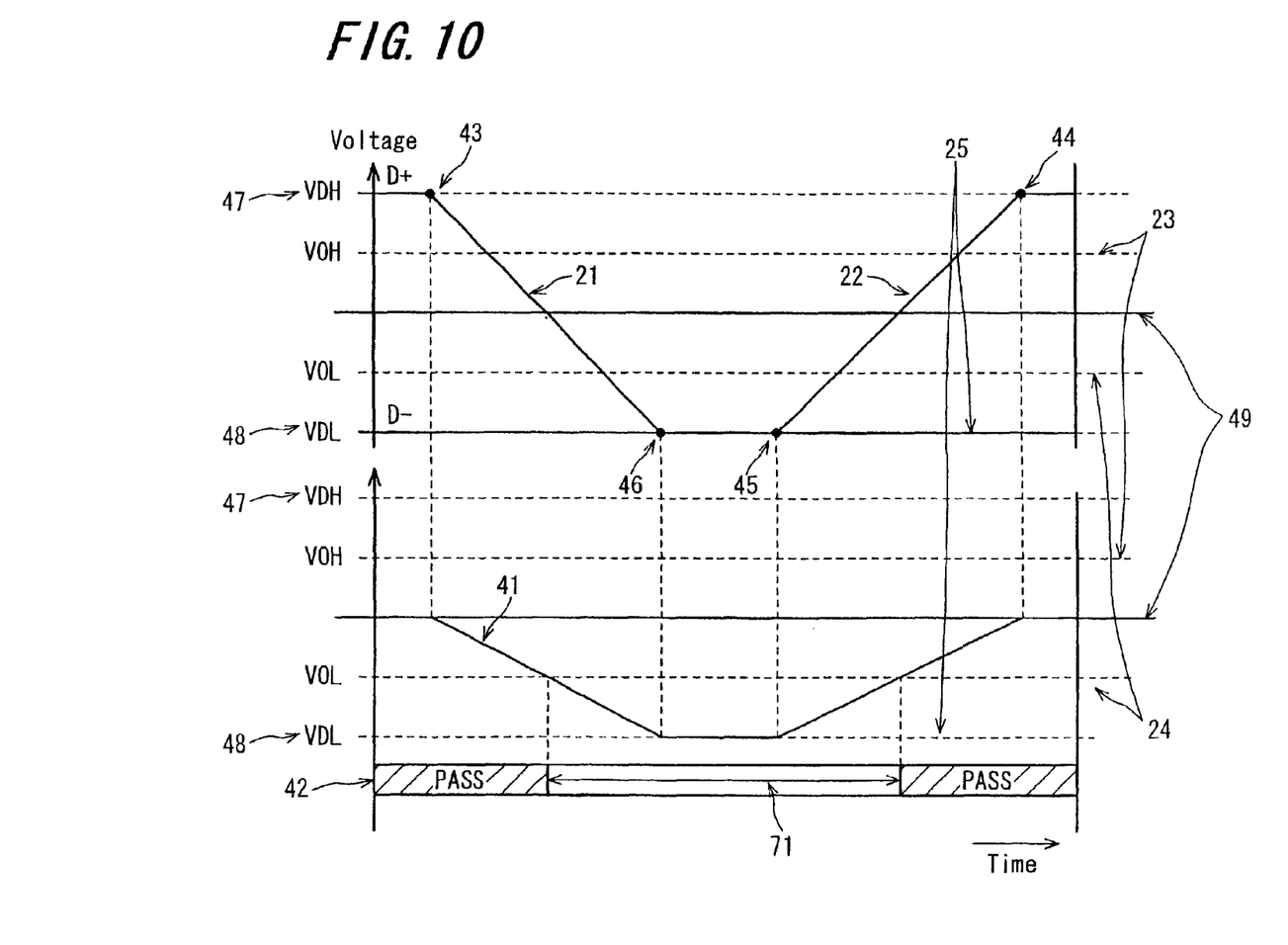
FIG. 10 is a signal waveform chart showing a test fail case where (D+) data output signal 21 and (D−)data output signal 22 do not cross each other during their transitions, hence there is no crossover voltage falling within the reference voltage range.

FIGS. 9 and 10 are signal waveform charts showing test fail cases where (D+)data output signal 21 and (D−)data output signal 22 do not cross each other during their transitions, hence the composite signal fails to fall within the reference voltage range. Similarly to the cases shown in FIGS. 7 and 8, it is possible for tester 2 to detect the fact that the crossover voltage(VCRS) 25 fails to fall within the reference voltage range defined by the crossover upper limit voltage(VOH) 23 and the crossover lower limit voltage (VOL) 24, by using strobe signal 42 to detect a fail period 71 during which composite signal 41 fails to fall within the reference voltage range.

As described heretofore, use of the tester and testing method for differential data drivers according to the embodiment of the present invention makes it possible to implement the test on differential data drivers readily with a simple configuration.

According to the present invention, the following effects can be obtained.

Since the tester for differential data drivers of the present invention determines the acceptability of the differential signals from a differential data driver, based on the sum of the voltages of the two signals output from two data output terminals of the differential data driver, it is possible to make a judgement as to the acceptability of the differential signals without measuring any elapsed time, hence simplify the tester configuration. Further, since the sum of the voltages of the (D+)data output signal and (D−)data output signal is examined, the tester can make the test using a single channel. Accordingly, it is possible to implement high-precision measurement without being affected by channel-to-channel skew.

The tester for differential data drivers of the present invention includes a series of two resistors, having substantially equivalent resistance and arranged in such a manner that the two data output terminals of the differential data driver are connected to the ends of the series of resistors, whereby the sum of the potentials of the two signals is detected by resistively dividing the potentials of the two output signals from the differential data driver. Thus the tester can be provided in a simple configuration. Further, the combined signal of the (D+)data output signal and (D−)data output signal is used for testing, so that the test can be implemented using a single channel of the tester, which makes high-precision measurement free from influence of channel-to-channel skew possible.

Since in the tester for differential data drivers according to the present invention, a switching device is arranged at each end of the series of resistors, tests for other than the acceptability judgment as to the differential signals can be implemented excluding the influence of the series of resistors.

Since in the tester for differential data drivers according the present invention, the switching devices are opened when tests other than the acceptability judgement as to the differential signals are implemented, the series of resistors can be used appropriately depending on the purpose of the test in the tester.

In the present invention, since the acceptability of the differential signals from a differential data driver is determined based on the sum of the voltages of the two signals output from two data output terminals of the differential data driver, the acceptability judgement as to the differential signals can be made without measuring any elapsed time, thus making it possible to test differential data drivers easily.

What is claimed is:

1. A tester apparatus for testing differential data drivers, comprising:

input terminals for receiving at least two differential signals outputted from a differential output driver;

a first tester circuit; and a second tester circuit connected to the first tester circuit, the first and second tester circuits directly receiving the at least two differential signals, wherein the acceptability of the at least two differential signals from the differential output driver is determined based on the sum of the voltages of the two signals.

2. The tester apparatus for differential data drivers according to claim 1, wherein the first tester circuit includes a pair of resistors, having substantially equivalent resistance, arranged in series so that the input terminals are connected to the ends of the series of resistors, whereby the sum of the voltages of the two signals are detected by resistively dividing the voltages of the two differential signals from the differential output driver.

3. The tester apparatus for differential data drivers according to claim 2, wherein a switching device is arranged at each end of the series of resistors.

4. The tester apparatus for differential data drivers according to claim 3, wherein the switching devices are opened when tests other than an acceptability judgement as to the differential signals are implemented whereby the pair of resistors in the first tester circuit are bypassed.

5. The tester apparatus for the differential data drivers according to claim 1, wherein the acceptability of the at least two differential signals can be determined on a single channel.

6. The tester apparatus for the differential data drivers according to claim 1, wherein the acceptability of the at least two differential signals can be determined without measuring any elapsed time.

7. A testing method for differential data drivers, comprising:

receiving at input terminals at least two differential signals from a differential output driver, the at least two differential signals flowing directly into a first and second tester circuit;

detecting the sum of the voltages of the at least two differential signals in the first tester circuit and feeding the result to the second testing circuit;

wherein the acceptability of the two differential signals from the differential output driver is determined based on the sum of the voltages of the two signals.

* * * * *